United States Patent [19]
Lee et al.

[11] Patent Number: 5,485,426
[45] Date of Patent: Jan. 16, 1996

[54] SEMICONDUCTOR MEMORY DEVICE HAVING A STRUCTURE FOR DRIVING INPUT/OUTPUT LINES AT A HIGH SPEED

[75] Inventors: Si-Yeol Lee, Kyungki-do; Hyun-Soon Jang, Seoul; Myung-Ho Kim, Kyungki-do, all of Rep. of Korea

[73] Assignee: Samsung Electronics Co., Ltd., Suwon, Rep. of Korea

[21] Appl. No.: 289,583

[22] Filed: Aug. 15, 1994

[30] Foreign Application Priority Data

Aug. 14, 1993 [KR] Rep. of Korea ................ 15744/1993

[51] Int. Cl.$^6$ ................................................ G11C 29/00
[52] U.S. Cl. ............... 365/203; 365/230.03; 365/230.04; 365/230.06
[58] Field of Search .............................. 365/203, 230.03, 365/230.04, 207, 208, 220, 189.05, 230.08, 230.06

[56] References Cited

U.S. PATENT DOCUMENTS 5,295,254  3/1994  Ogawa ................................ 365/230.04
5,299,161  3/1994  Choi et al. ................................ 365/220
5,381,367  1/1995  Kajimoto ............................ 365/230.04

Primary Examiner—David C. Nelms
Assistant Examiner—Vu A. Le
Attorney, Agent, or Firm—Robert A. Westerlund; Stephen R. Whitt; Charles R. Donohoe

[57] ABSTRACT

A semiconductor memory device for alternately selecting two groups of input/output lines according to a predetermined column address. A first group of a number of the input/output line pairs is driven by activation of any one of the selection signals within the first group, and a second group of a number of the input/output line pairs is driven by activation of any one of the selection signals within the second group. Furthermore, the input/output line pairs within the second group are precharged and equalized when the input/output line pairs within the first group are driven, and the input/output line pairs within the first group are precharged and equalized when the input/output line pairs within the second group are driven.

9 Claims, 11 Drawing Sheets

SEMICONDUCTOR MEMORY DEVICE HAVING A STRUCTURE FOR DRIVING INPUT/OUTPUT LINES AT A HIGH SPEED

BACKGROUND OF THE INVENTION

1. Field of the Invention

The present invention relates to a semiconductor memory device for transferring to be stored to or read from a memory cell array through input/output lines, and more particularly to a semiconductor memory device which selects the input/output lines by using column addresses.

2. Description of the Related Art

On a semiconductor memory device, such as a dynamic RAM, a predetermined memory cell is selected by selecting one of a plurality of word lines and one of a plurality of column select lines. The word line is selected by a row address signal latched in response to activation of a row address strobe signal RAS and a bit line is selected by a column address signal latched in response to activation of a column address strobe signal CAS.

When reading data from or writing data to the selected memory cell, a selected one of a plurality of column selection switches connects an input/output line pair to a corresponding sense amplifier at an appropriate time. Furthermore, upon transfer of the data bit through the sense amp to a corresponding pair of input/output lines, the input/output lines develop complementary potentials through charge sharing. At this moment, unselected input/output line pairs are equalized and precharged to a predetermined potential.

FIG. 1 shows the connection between a sub memory cell array and input/output line pairs in a conventional dynamic RAM and FIG. 2 shows timing therefore. The sub memory cell array is comprised of k word lines WL0 through WLK-1, m bit line pairs BL0 through BLm-1 and $\overline{BL0}$–$\overline{BLM-1}$, and (k×m) memory cells 10. A plurality of column selection switches 20 are each connected between m sense amplifiers SA connected to the bit line pairs and the input/output lines pairs.

A typical dynamic RAM is divided into four memory banks each including a number of sub memory cell arrays having a folded bit line structure. The dynamic RAM may have more than four memory banks. For instance, a 16 Mbit DRAM includes memory banks of 4 Mbits each, which are each divided into 16 sub memory cell arrays. The sub memory cell array of FIG. 1 has 256 Kbits including 256 word lines (k=256) and 1024 (1K) bit lines (m=1024).

The input/output line pairs I/O0, $\overline{I/O0}$, I/O1 and $\overline{I/O1}$ are arranged to one side (i.e. the left hand side of FIG. 2) of the sub memory cell array. The input/output line pairs I/O0', $\overline{I/O0'}$, I/O1' and $\overline{I/O1'}$ are arranged to an opposite side (i.e. the right hand side of FIG. 2) of the sub memory cell array. The input/output line pairs constitute an input/output bus which is shared by the adjacent sub memory cell arrays. That is, the input/output line pairs I/O0, $\overline{I/O0}$, I/O1 and $\overline{I/O1}$ arranged on the left hand side of the sub memory cell array constitute a left input/output bus and the input/output line pairs I/O0', $\overline{I/O0'}$, I/O1', and $\overline{I/O1'}$ arranged on the right hand side of the sub memory cell array constitute a right input/output bus. The input/output lines in the respective data busses transfer 2-bit data, alternatively. Column selection lines CSL0 through CSLi-1 are respectively connected to and control the column selection switches 20 corresponding to the respective bit line pairs having the 2-bit data. Therefore, if any one column selection line is activated, 2-bit data are transferred respectively through the left and right input/output buses. A total of four bits of data are transferred in the dynamic RAM device for each active column select line CSL0 through CSLi-1.

As shown in FIG. 2, the input/output line pairs I/O0, $\overline{I/O0}$, I/O1,2, I/O0', $\overline{I/O0'}$ I/O1' and $\overline{I/O1'}$ are equalized and precharged to a precharged level, which is commonly a value determined by subtracting a threshold voltage of an NMOS transistor from a power supply voltage, in response to an input/output line precharge signal. The input/output line pairs are developed to a "high" state and to a "low" state when any one of the column selection lines is activated to a "high" state. Alternatively, the input/output line pairs are all equalized and precharged to the precharge level in response to the input/output line precharge signal when none of the column selection lines are activated.

As an example of the operation, if the column selection signal CSL0 is activated to a "high" state, the 2-bit data read from the bit line pairs BL0, $\overline{BL0}$, BL1 and $\overline{BL1}$ are transferred to the left input/output bus, i.e., two input/output line pairs I/O0, $\overline{I/O0}$, I/O1 and $\overline{I/O1}$, via the respective sense amplifiers and the column selection switches 20, and developed according to the potential of the data bits. At the same time, the 2-bit data read from the bit line pairs BL2, $\overline{BL2}$, BL3 and $\overline{BL3}$ are transferred to the right input/output bus, i.e., two input/output line pairs I/O0', $\overline{I/O0'}$, I/O1' and $\overline{I/O1'}$, via the respective sense amplifiers and the column selection switches 20 and developed according to the potential of the data bits. After the data developed on the input/output line pairs I/O0, $\overline{I/O0}$, I/O1, $\overline{I/O1}$I/O0', $\overline{I/O0'}$, I/O1' and $\overline{I/O1'}$ are transferred to a data bus and a data output buffer (not shown) in the dynamic RAM, the developed input/output lines pairs are equalized and precharged in response to the input/output line precharge signal to be ready for a subsequent transfer of the next data bits. Subsequently, if the column selection line CSL1 is activated to a "high" state, 2-bit data read from the bit line pairs are transferred to the input/output line pairs I/O0, $\overline{I/O0}$, I/O1 and $\overline{I/O1}$ and 2-bit data read from the bit line pairs BL6, $\overline{BL6}$, BL7 and $\overline{BL7}$ are transferred to the input/output line pairs I/O0', $\overline{I/O0'}$, I/O1' and $\overline{I/O1'}$, so that input/output line pairs I/O0, $\overline{I/O0}$, I/O1, $\overline{I/O1}$, I/O0', $\overline{I/O0'}$, I/O1' and $\overline{I/O1'}$ are developed in the same manner as mentioned above with respect to the activation of CSL0.

In the conventional semiconductor memory device, when column selection lines are activated, all of the left and right input/output buses (4 bits of data) are first developed to reflect the data and then precharged and equalized to be prepared for the next data transfer. The conventional memory device, therefore, has a disadvantage because the speed of the device is limited by the amount of time required to equalize and precharge the input/output line pairs between accesses of the memory cells. Whenever a column selection line is activated, the 2-bit data are developed on all four input/output line pairs constituting the left and right input/output buses. Further, between the times when the four bits of data are developed in the input/output line pairs, an amount of time is necessary for precharging and equalizing the input/output line pairs before the next pairs of 2-bit data are developed. Therefore, the conventional device is limited because extra time must be used to ensure that a sufficient amount of time is allocated between accesses of the input/output line pairs so that both the data transfer operation and the precharge operation are completed. Thus, this limits the data transfer rate in a conventional memory device.

SUMMARY OF THE INVENTION

It is, therefore, an object of the present invention to provide a semiconductor memory device capable of transferring data to the input/output lines at a high speed.

It is another object of the present invention to provide a semiconductor memory device having input/output lines precharged and equalized during a stand-by state of the memory device wherein the overall time needed for data transfer, equalization and precharge operations is decreased.

It is still another object of the present invention to provide a semiconductor memory device capable of transferring data successively without being restricted by the amount of time needed for equalization and precharge operations.

According to an aspect of the present invention, in the semiconductor memory device having a number of input/output line pairs, a first group of input/output line pairs are driven by a first selection signal of a first group of selection signals, and a second group of input/output line pairs are driven by a second selection signal of a second group of selection signals. Furthermore, the second group of input/output line pairs is precharged and equalized during the driving operation of the first group of input/output line pairs. On the other hand, the first group of input/output line pairs is precharged and equalized during the driving operation of the second group of input/output line pairs.

According to the present invention, therefore, it is not necessary to adjust the activation time of the column selection signal which selects the desired input/output line pairs in order to allow enough time for precharging, unlike the unconventional device.

BRIEF DESCRIPTION OF THE DRAWINGS ACCOMPANYING

The above and other objects, advantages and features of the present invention will be more apparent from the following detailed description taken with the attached drawings in which:

FIGS. 3A and 3B, and FIGS. 8A and 8B are connected.

DETAILED DESCRIPTION OF THE PREFERRED EMBODIMENT

The preferred embodiment of the present invention described hereinbelow is suitable for high density semiconductor memory devices which perform successive data transfer operations. In particular, the preferred embodiment of the present invention is suitable for a high density semiconductor memory device operating in synchronism with a external synchronous clock.

One embodiment of the semiconductor memory device in accordance with the present invention is a 16 Mbit memory divided into four 4 Mbit memory banks each being divided again into 16 sub memory cell arrays of 256 Kbits. The memory device employs a folded bit line structure.

Figure 1:
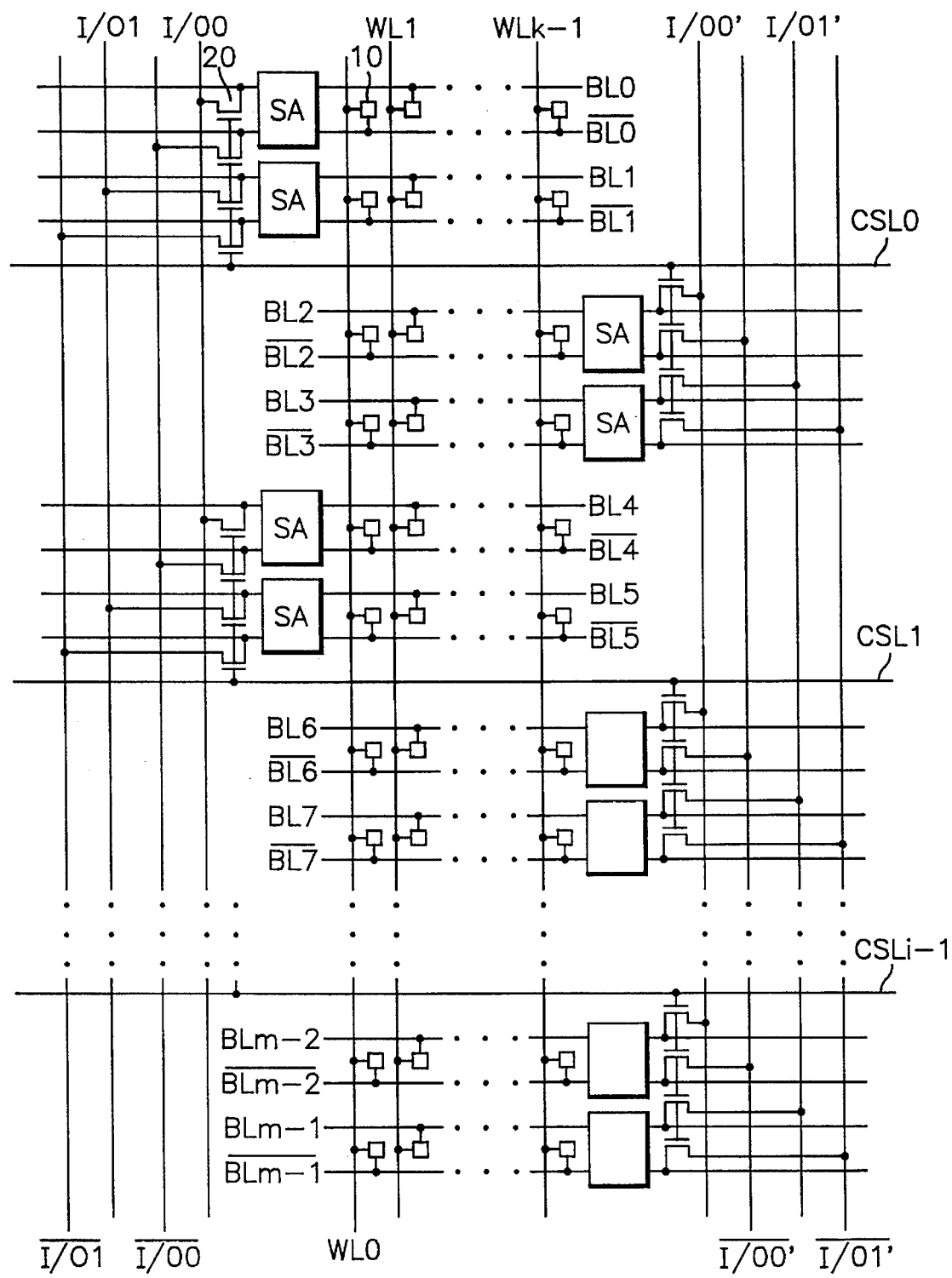
FIG. 1 is a circuit timing diagram showing an operation that an input/output line is selected and driven in the conventional semiconductor memory device.
Figure 2:
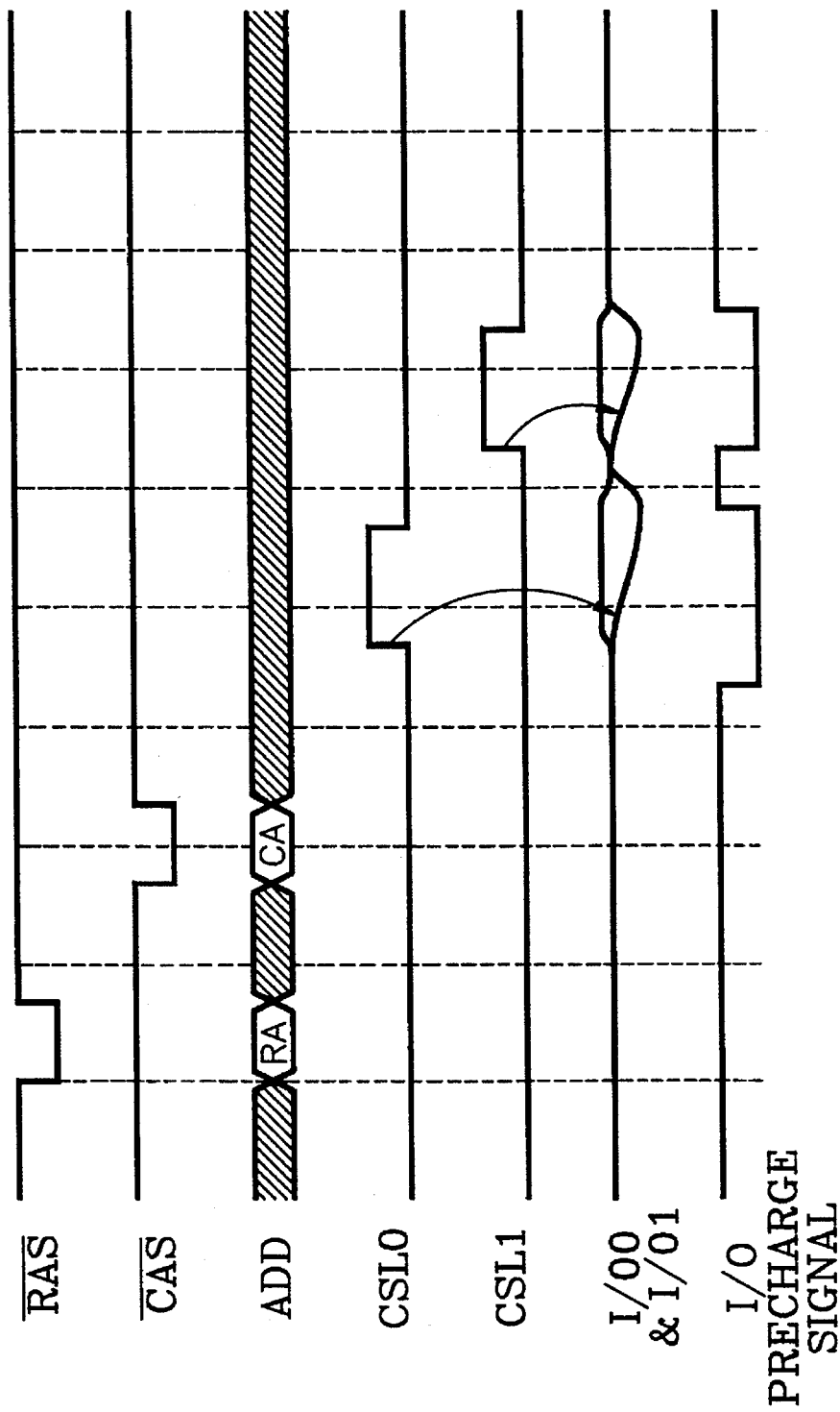
FIG. 2 is a timing diagram showing an operation that an input/output line is selected and driven in the conventional device of FIG. 1.
Figure 3A:
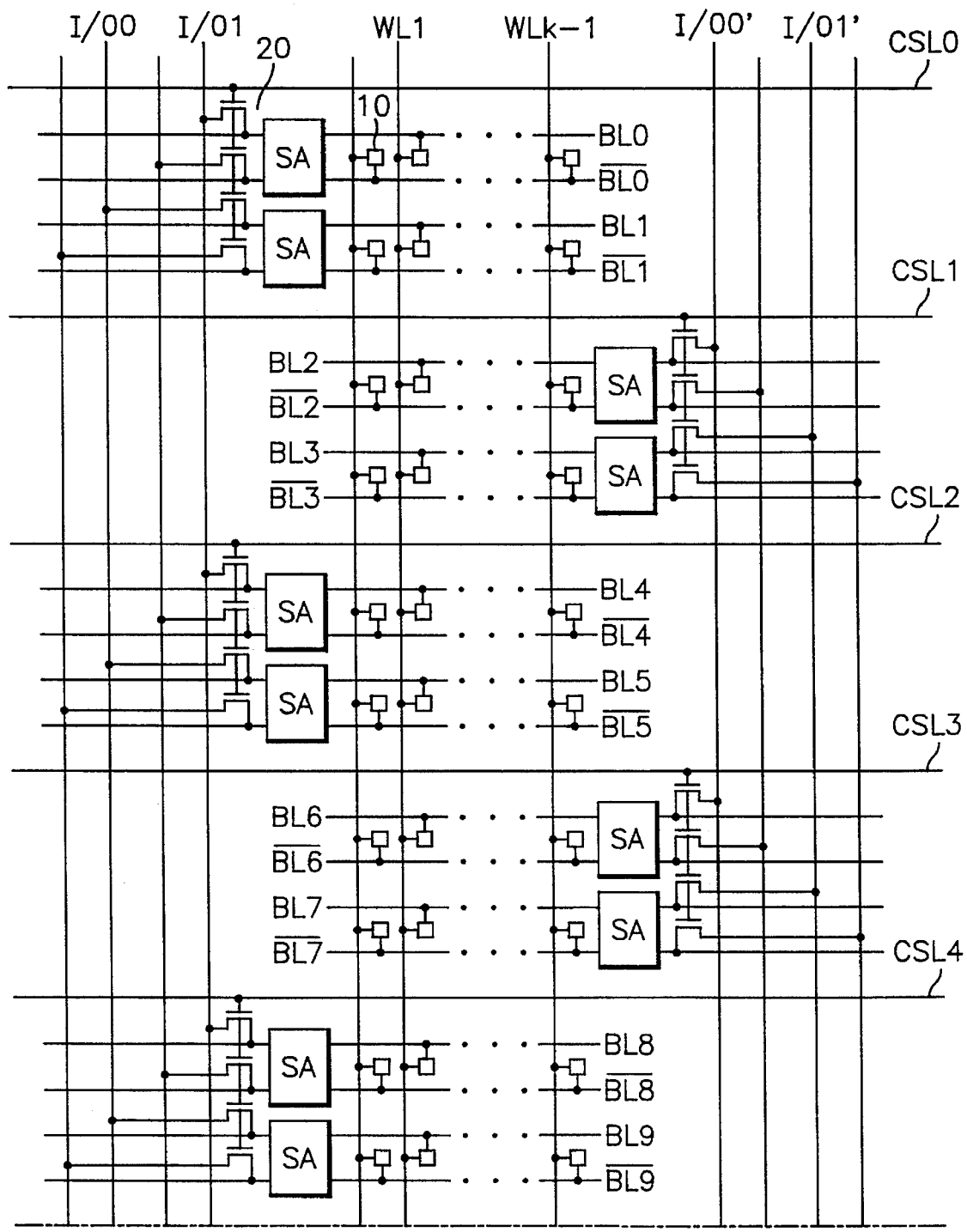
FIG. 3A is a circuit diagram showing the connections between a sub memory cell array and input/output lines in a semiconductor memory device according to the present invention.
Figure 3B:
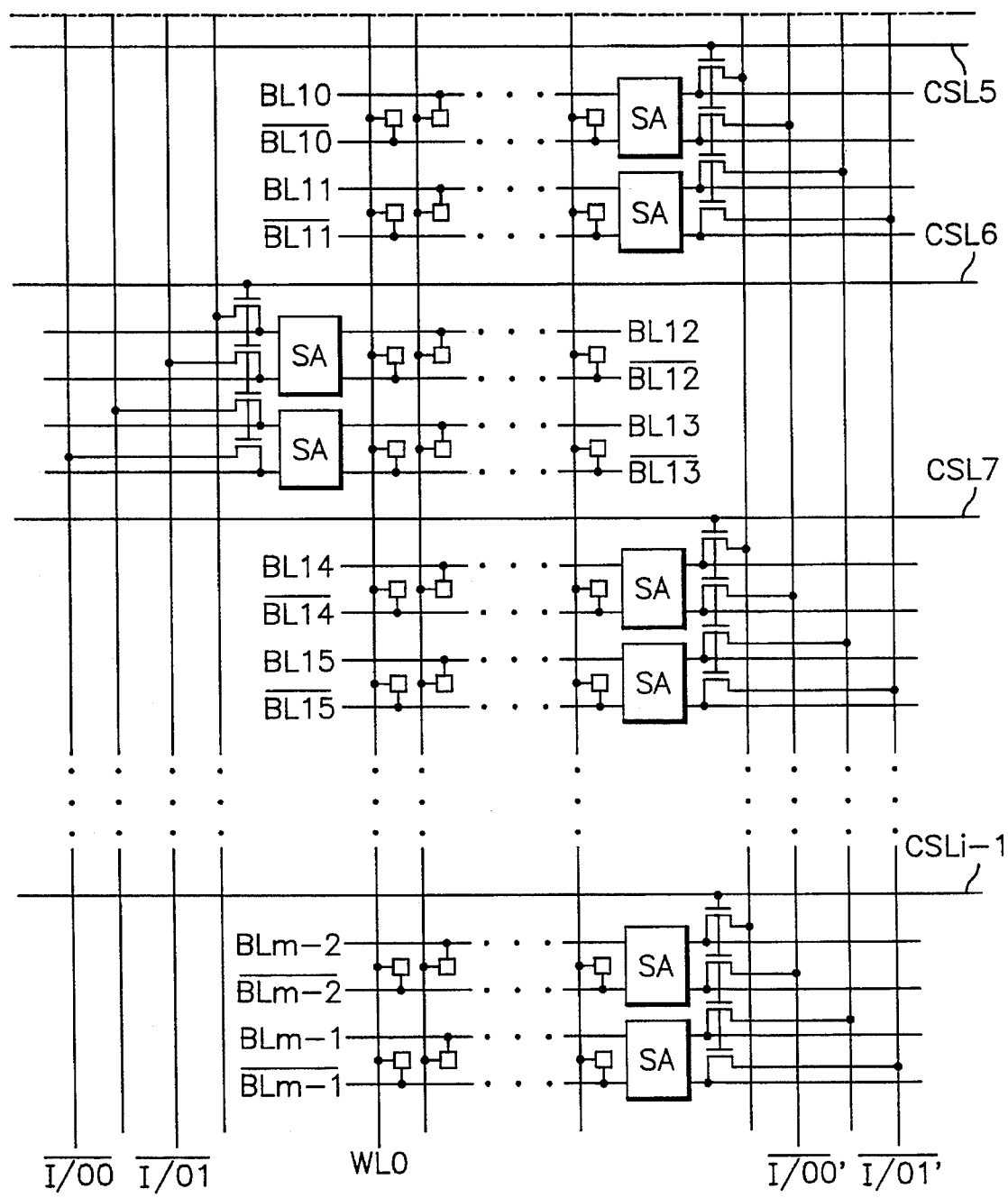
FIG. 3B is a circuit diagram extending from FIG. 3A.

Referring to FIGS. 3A and 3B, since the semiconductor memory device according to the present invention is comprised of a dynamic RAM having 256 Kbit sub memory cell arrays, the sub memory cell arrays are comprised of 256 word lines, 1024 bit line pairs, and (256×1024) memory cells 10. The bit line pairs BL0/$\overline{BL0}$–BLm-1/$\overline{BLm-1}$ are connected to the input/output line pairs I/O0, $\overline{I/O0}$, I/O1, $\overline{I/O1}$, I/O0', $\overline{I/O0'}$, I/O1' and $\overline{I/O1'}$ via the sense amplifiers SA and the column selection switches 20. The input/output line pairs I/O0, $\overline{I/O0}$, I/O1 and $\overline{I/O1}$ are arranged to constitute a left input/output bus of the sub memory cell array, and the input/output line pairs I/O0', $\overline{I/O0'}$, I/O1' and $\overline{I/O1'}$ are arranged to constitute a right input/output bus of the sub memory cell array.

Referring to FIGS. 3A and 3B, column selection switches 20 connecting the input/output line pairs I/O0, $\overline{I/O0}$, I/O1 and $\overline{I/O1}$ on the left hand side of the sub memory cell array to the sense amplifiers SA are connected only to even-numbered column selection lines (CSL0, CSL2, CSL4, CSL6, . . . , CSLi). The column selection switches 20 connecting the input/output line pairs I/O0', $\overline{I/O0'}$, I/O1' and $\overline{I/O1'}$ on the right hand side of the sub memory cell array to the sense amplifiers SA are connected only to odd-numbered column selection lines (CSL1, CSL3, CSL5, CSL7 . . . . , CSLi-1). The column selection lines are perpendicular to the input/output lines and are connected to other sub memory cell arrays within the dynamic RAM.

The left input/output line pairs are developed and precharged and equalized at different time intervals from development and precharge and equalization of the right input/output line pairs. That is, according to the present invention, after the word line WL0 and the column selection line CSL0 are activated, the 2-bit data read from the two bit line pairs BL0, $\overline{BL0}$, BL1 and $\overline{BL1}$ are transferred to the input/output line pairs I/O0, $\overline{I/O0}$, I/O1 and $\overline{I/O1}$ on the left hand side of the sub memory cell array. The input/output lines I/O0', $\overline{I/O0'}$, I/O1' and $\overline{I/O1'}$ on the right hand side of the sub memory cell array are precharged and equalized in response to the corresponding precharge signal when the input/output line pairs I/O0, $\overline{I/O0}$, I/O1 and $\overline{I/O1}$ are developed. Conversely, the input/output line pairs I/O0', $\overline{I/O0'}$, I/O1' and $\overline{I/O1'}$ on the right hand side of the sub memory cell array are developed according to the 2-bit data read from the bit line pairs BL2, $\overline{BL2}$, BL3 and $\overline{BL3}$ when the input/output line pairs I/O0', $\overline{I/O0'}$, I/O1' and $\overline{I/O1'}$ are precharged and equalized. The column selection signals provided to the column selection lines are generated in response to the decoded signals of the column address signals provided from an address counter in the dynamic RAM.

FIGS. 4A through 7 show circuits for implementing the driving operation and the precharge method of the input/output line according to the embodiment of FIG. 3 of the present invention.

FIGS. 4A through 4E show the column predecoder circuit for generating the column address predecoding signals to generate the column selection signals provided to the column selection lines shown in FIG. 3. Referring to FIG. 4, the column predecoder includes a first predecoder 100 for receiving a signal φYE for driving the CAS chain associated with the column address strobe signal $\overline{CAS}$ upon completion of generating row chain signals associated with the row address strobe signal $\overline{RAS}$, a column address signal CA11 associated with a block selection (in a single memory bank structure, however, a row address signal can be used for the same) and column address signals CA0 and CA1, so as to generate column predecoding signals $DCA\overline{01}$, $DCA\overline{0}1$, $DCA0\overline{1}$, and DCA01 in dependence upon the logic states of column address signals CA0 and CA1. A second predecoder 200 receives the column address signal CA11 and column address signals CA2 and CA3, so as to generate column predecoding signals $DCA\overline{23}$, $DCA\overline{2}3$, $DCA2\overline{3}$, and DCA23 in dependance upon the logic states of the column address signals CA2 and CA3. A third predecoder 300 receives the column address signal CA11 and column address signals CA4 and CA5, so as to generate column predecoding signals $DCA\overline{45}$, $DCA\overline{4}5$, $DCA4\overline{5}$, and DCA45 in dependence upon the logic states of the column address signals CA4 and CA5. A fourth predecoder 400 receives the column address signal CA11 and column address signals CA6 and CA7, so as to generate column predecoding signals $DCA\overline{67}$, $DCA\overline{6}7$, $DCA6\overline{7}$, and DCA67 in dependance upon the logic states of the column address signals CA6 and CA7, and a fifth predecoder 500 receives the column address signals CA11 and a column address signal CA8 so as to generate column predecoding signals in dependence upon the logic state of the column address signal CA8. Since the number of the column address signals CA0 through CA8 applied to the column predecoders in nine, 512 column selection signals associated with 1024 bit line pairs constituting a sub memory cell array of FIG. 3 can be generated by using the nine column address signals.

The first predecoder 100 comprises NAND gates 32 and 38 to which the signal φYE is commonly inputted and the column address signals $\overline{CA0}$ and CA0 are respectively inputted. NAND gates 34 and 36 have the column address signal CA11 commonly inputted and the column address signals CA1 and $\overline{CA1}$ respectively inputted. Inverters 33, 35, 37 and 39 invert the output signals of the NAND gates 32, 34, 36 and 38, respectively. NAND gates 42 and 44 have the output signal of the inverter 33 commonly inputted and the output signals of the inverters 37 and 35 respectively input. NAND gates 46 and 48 have the output signal of the inverter 39 commonly inputted and the output signals of the inverters 37 and 35 respectively inputted. Serially-connected inverters 43,51; 45,52; 47,53; and 49,54 shape the output signals of NAND gates 42, 44, 46 and 48 to generate the column predecoding signals $DCA\overline{01}$–DCA01.

The structures of the second through fourth predecoders 200 to 400 are similar to that of the first predecoder 100. The second predecoder 200 includes inverters 61 and 63 for inverting the logic states of the column address signals $\overline{CA2}$ and CA2, NAND gates 62 and 64 to which the column address signal CA11 is commonly inputted and the column address signals CA3 and $\overline{CA3}$ are respectively inputted, NOR gates 66 and 68 to which the output signal of the inverter 61 is commonly inputted and the output signals of the NAND gates 64 and 62 are respectively inputted, NOR gates 72 and 74 to which the output signal of the inverter 63 is commonly inputted and the output signals of the NAND gates 64 and 62 are respectively inputted, and serially-connected inverters 65,73; 67,75; 69,77; and 71,78 for shaping the output signals of the NOR gates 66, 68, 72 and 74 to generate the column predecoding signals $DCA\overline{23}$–DCA23.

The fifth predecoder 500 includes NAND gates 82 and 84 to which the column address signal CA11 is commonly inputted and the column address signals CA8 and $\overline{CA8}$ are respectively inputted, inverters 83, 87 and 91 connected in series for shaping and inverting the output signal of the NAND gate 82 to generate a column predecoding signal DCA8, and serially-connected inverters 85, 89 and 93 for shaping and inverting the output signal of the NAND gate 84 to generate a predecoding signal $DCA\overline{8}$.

Figure 4A:
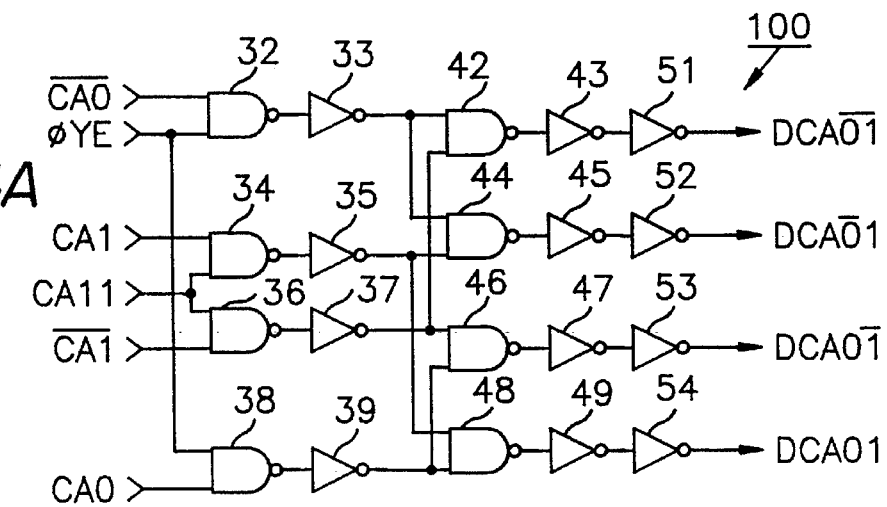
FIGS. 4A through 4E are circuit diagrams showing column predecoders used for selecting input/output lines according to the present invention.
Figure 4B:
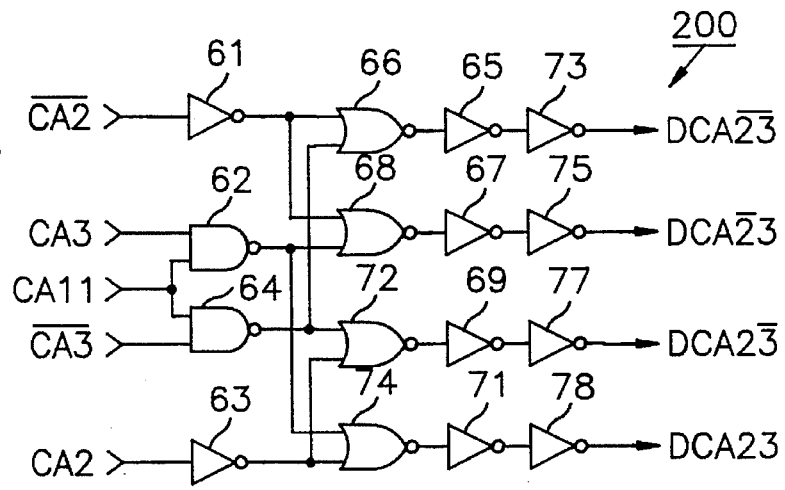
Figure 4C:
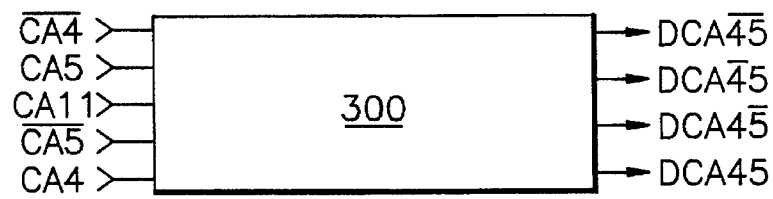
Figure 4D:
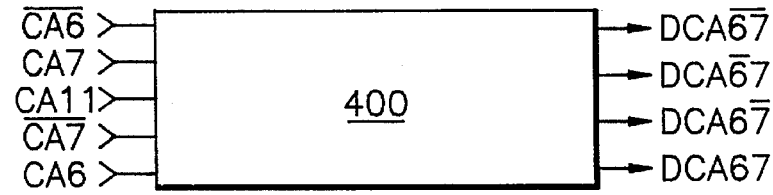
Figure 4E:
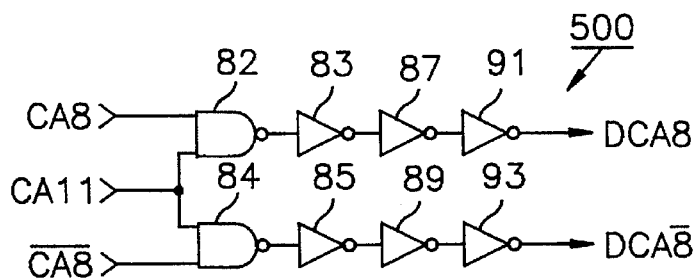
Figure 5:
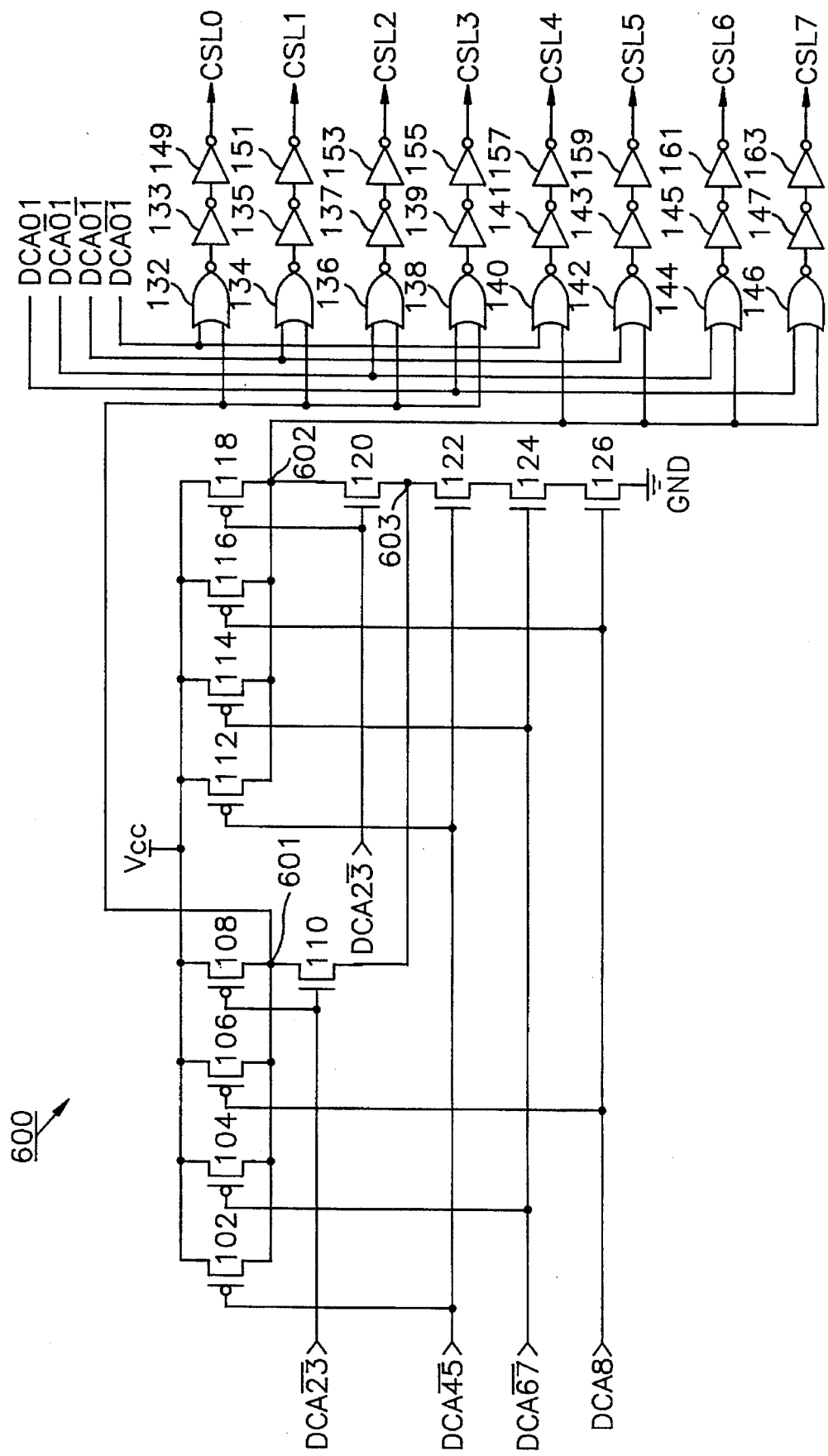
FIG. 5 is a circuit diagram showing a column selection circuit generating column selection signals, responsive to the output signals of the predecoders of FIGS. 4A through 4E.

The column predecoding signals $DCA\overline{01}$–DCA8 are provided to a column selection circuit 600, as shown in FIG. 5. The column selection circuit 600 shown in FIG. 5 shows a specific part of the column selection circuit for generating leading eight column selection signals CSL0 through CSL7 from 512 column selection signals generated in the column selection circuit by receiving the predecoding signals output from the first through fourth column predecoders 100–400 shown in FIGS. 4A through 4E. Therefore, 64 column selection circuits which are the same as that of FIG. 5 are necessary to generate 512 column selection signals.

Referring to FIG. 5, NOR gates 132, 134, . . . , 144 and 146 each having two inputs compare the logic states of the predecoding signals provided from the column predecoders shown in FIGS. 4A through 4E. The NOR gates 132, 134, . . . , 144 and 146 generate the column selection signals CSL0 through CSL7 via serially-connected inverters 133,149; 135,151; . . . ; 145,161, and 147,163. The column predecoding signals $DCA\overline{01}$–DCA01 provided from the first predecoder 100 are applied to one of the two inputs of the respective NOR gates. The column predecoding signal $DCA\overline{01}$ is inputted to the first NOR gate 132 and the fifth NOR gate 140, the column predecoding signal $DCA\overline{0}1$ to the second NOR gate 134 and the sixth NOR gate 142, the column predecoding signal $DCA0\overline{1}$ to the third NOR gate 136 and the seventh NOR gate 144, and the column predecoding signal DCA01 to the fourth NOR gate 138 and the eighth NOR gate 146. Furthermore, the inputs of the NOR gates 132 through 138 are connected to a first control node 601 and the inputs of the NOR gates 140–146 are connected to a second control node 602, wherein the logic levels at the first and second control nodes 601 and 602 are determined by the logic states of the column predecoding signals $DCA\overline{23}$, $DCA2\overline{3}$, $DCA\overline{45}$, $DCA\overline{67}$ and $DCA\overline{8}$ provided from the column predecoders 200 through 500. PMOS transistors 102, 104, 106 and 108 have gates respectively connected to the column predecoding signals $DCA\overline{45}$, $DCA\overline{67}$, $DCA\overline{8}$ and $DCA\overline{23}$. The PMOS transistors 102, 104, 106 and 108 are connected in parallel between the first control node 601 and the power supply voltage Vcc. Furthermore, PMOS transistors 112, 114, 116, and 118 have gates respectively connected to the column predecoding signals $DCA\overline{45}$, $DCA\overline{67}$, $DCA\overline{8}$ and $DCA2\overline{3}$ and are connected in parallel between the second control node 602 and the power supply voltage Vcc. An NMOS transistor 110 having a gate connected to the column predecoding signal $DCA\overline{23}$ is connected between the first control node 601 and a third control node 603, and an NMOS transistor 120 having a gate connected to the column predecoding signal $\overline{DCA23}$ is connected between the second control node 602 and the third control node 603. NMOS transistors 122, 124 and 126 having gates respectively connected to the column predecoding signals $\overline{DCA45}$, $\overline{DCA67}$ and $\overline{DCA8}$ are connected in series between the third control node 603 and the ground voltage GND. The column selection signals CSL0 through CSL7 generated from the column selection circuit 600 are respectively provided to the column selection lines.

Figure 6:
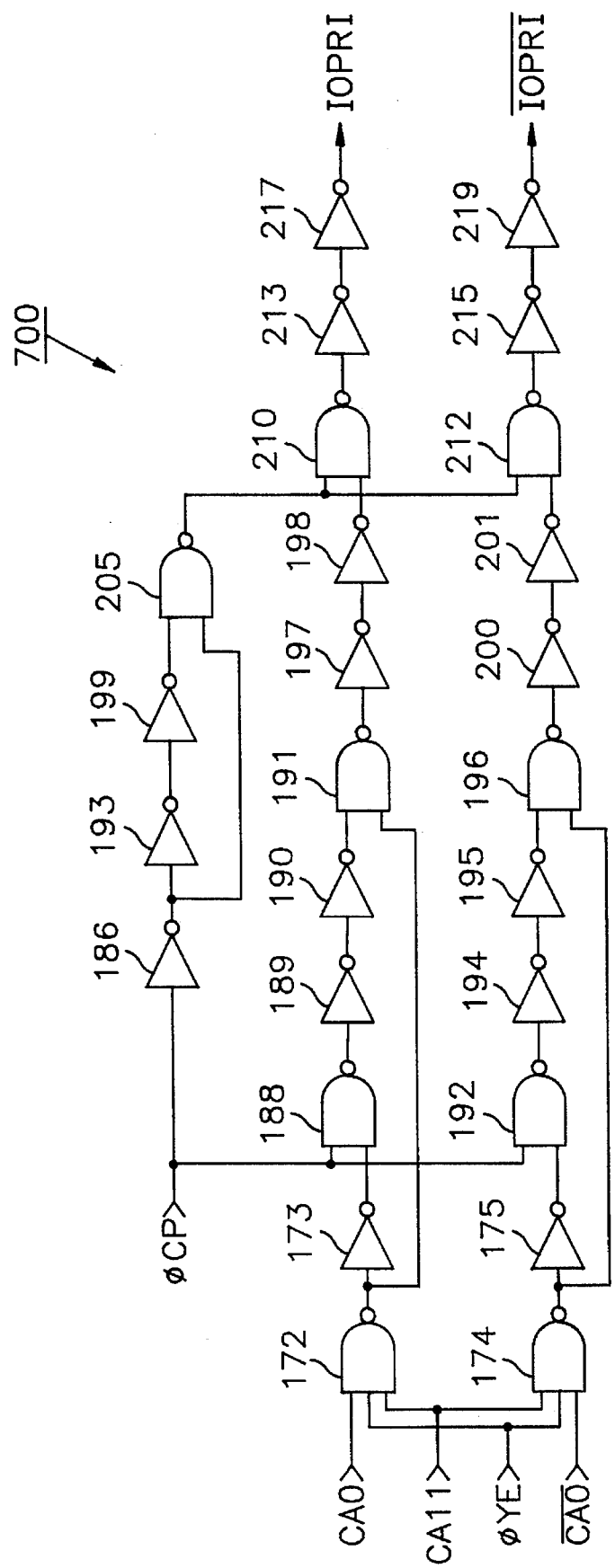
FIG. 6 is a circuit diagram of an input/output line precharge signal generator for generating an input/output line precharge signal for precharging the input/output lines according to the present invention.

FIG. 6 shows a precharge circuit 700 generating precharge signals IOPRI and $\overline{IOPRI}$ to precharge and equalize the input/output line pairs according to the present invention. The column address signal CA0 is applied through a NAND gate 172 which also receives the column address signal CA11 associated with the block selection. The column address signal is inputted to a NAND gate 174 together with the column address signal CA11. The NAND gates 172 and 174 are enabled and disabled by the signal φYE for driving column circuits upon receipt of the column address. Since the output of the NAND gate 172 is delayed through a delay circuit comprised of an inverter 173, and NAND gate 188, inverters 189 and 190, and a NAND gate 191, the output signal of the NAND gate 172 is generated from a NAND gate 191 with a specific time delay having a pulse width shorter than the signal CA0. The output signal of the NAND gate 191 is applied to a NAND gate 210 through inverters 197 and 198. Similarly, since the output of the NAND gate 174 is delayed through a delay circuit comprised of an inverter 175, a NAND gate 192, inverters 194 and 195, and a NAND gate 196, the output signal of the NAND gate 174 is generated from a NAND gate 196 with a specific time delay having a pulse width shorter than the signal $\overline{VA0}$. The output signal of the NAND gate 196 is applied to a NAND gate 212 through inverters 200 and 201.

A signal φCP is generated from a CAS buffer in the dynamic RAM which indicates the completion of generating the column address. The signal φCP is commonly inputted to the NAND gates 188 and 192 included in the delay circuits for delaying the respective output signals of the NAND gates 172 and 174. Furthermore, the signal φCP is commonly inputted to the NAND gates 210 and 212 via an inverter 186 and a delay circuit comprised of inverters 193 and 199, and a NAND gate 205. The output signal of the NAND gate 210 is generated as the input/output precharge signal IOPRI via inverters 213 and 217. The output signal of the NAND gate 212 is generated as the input/output line precharge signal $\overline{IOPRI}$.

Figure 7:
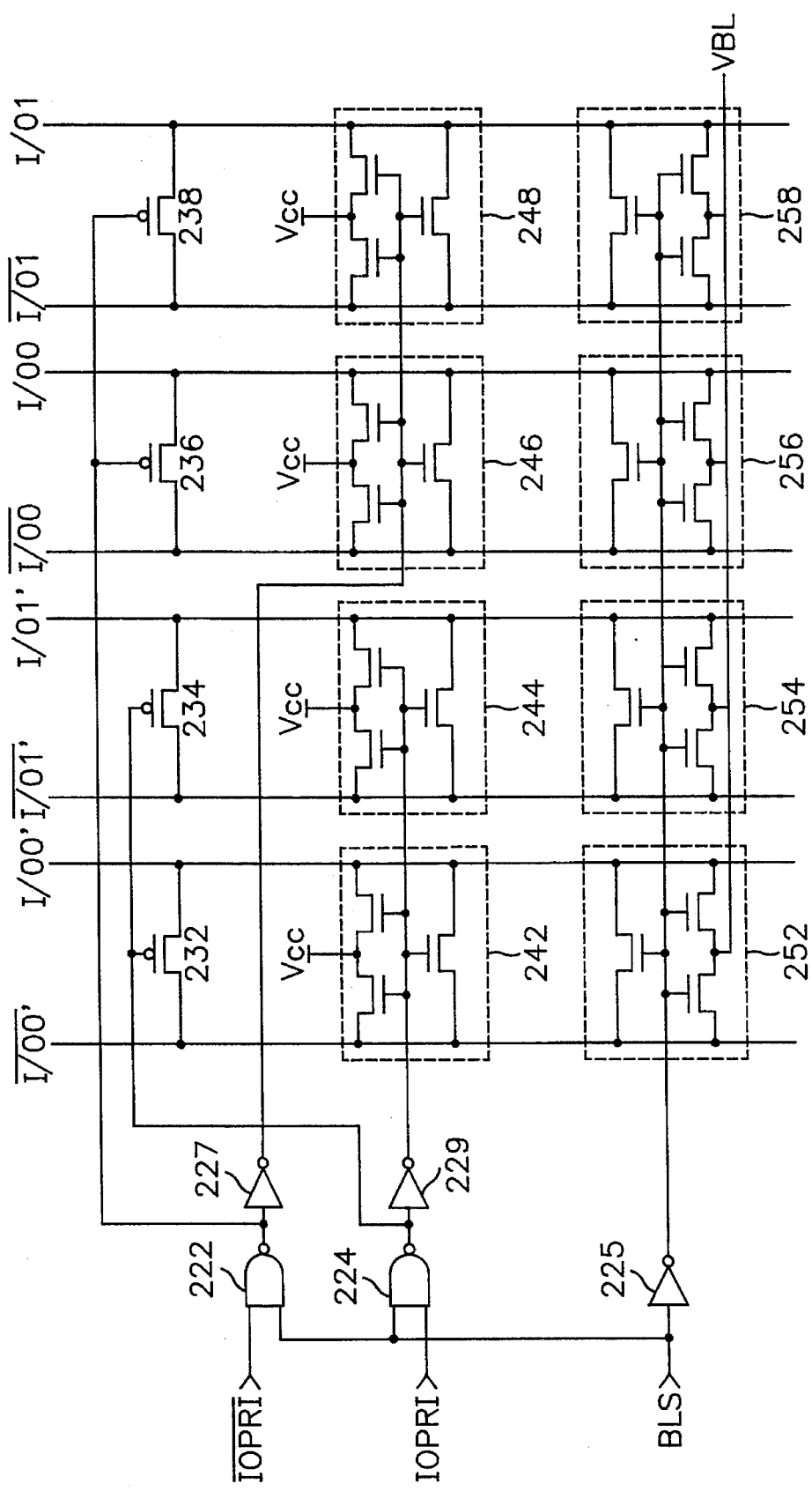
FIG. 7 is a circuit diagram of an input/output line precharge circuit for precharging the input/output lines according to the present invention.

FIG. 7 shows the connections between the input/output line precharge signals IOPRI and $\overline{IOPRI}$ generated in the circuit shown in FIG. 6 and the input/output line pairs in accordance with the present invention. As shown in FIG. 7, the signal $\overline{IOPRI}$ is associated with the precharge and equalization of the input/output line pairs I/O0, $\overline{I/O0}$, I/O0 and $\overline{I/O1}$ on the left hand side of the sub memory cell array shown in FIG. 3, and the signal IOPRI is associated with the precharge and equalization of the input/output line pairs I/O0', $\overline{I/O0'}$, I/O0' and $\overline{I/O1'}$ on the right hand side of the sub memory cell array shown in FIG. 3.

The input/output line pairs I/O1, $\overline{I/O1}$, I/O0, $\overline{I/O0}$, I/O1', $\overline{I/O1'}$, I/O0' and $\overline{I/O0'}$ are connected to PMOS transistors 238, 236, 234, and 232, which are used for equalization of the input/output line pairs. Precharge circuits 248, 246, 244, and 242 are comprised of NMOS transistors and receive the power supply voltage Vcc as a precharge voltage. The precharge circuits 248, 246, 244 and 242 are also connected to the input/output line pairs. Block precharge circuits 258, 256, 254, and 252 are also connected to the input/output line pairs and are comprised of NMOS transistors.

The block precharge circuits 258, 256, 254 and 252 receive a bit line precharge and equalization voltage VBL, and respectively operate in response to a block selection signal BLS. The gates of the NMOS transistors constituting the block precharge circuits are controlled by the block selection signal BLS via an inverter 225. The gates of PMOS transistors 238 and 236, which are connected to the input/output line pairs I/O1, $\overline{I/O1}$, I/O0 and $\overline{I/O0}$, are connected to an output of a NAND gate 222 receiving the block selection signal BLS and the input/output line precharge signal ($\overline{IOPRI}$). The gates of PMOS transistors 234 and 232, which are connected to the input/output line pairs I/O', $\overline{I/O1'}$, I/O0' and $\overline{I/O0'}$, are connected to the output of a NAND gate 224 receiving the block signal BLS and the input/output line precharge signal IOPRI. The gates of NMOS transistors constituting the precharge circuits 248 and 246, which are connected to the input/output line pairs I/O, $\overline{I/O1}$, I/O0 and $\overline{I/O0}$, are connected to the output of an inverter 227 which inverts the output signal of the NAND gate 222. The gates of NMOS transistors constituting the precharge circuits 244 and 242, which are connected to the input/output line pairs I/O1', $\overline{I/O1'}$, I/O0' and $\overline{I/O0'}$, are connected to the output of an inverter 229 which inverts the output signal of the NAND gate 224.

Figure 8A:
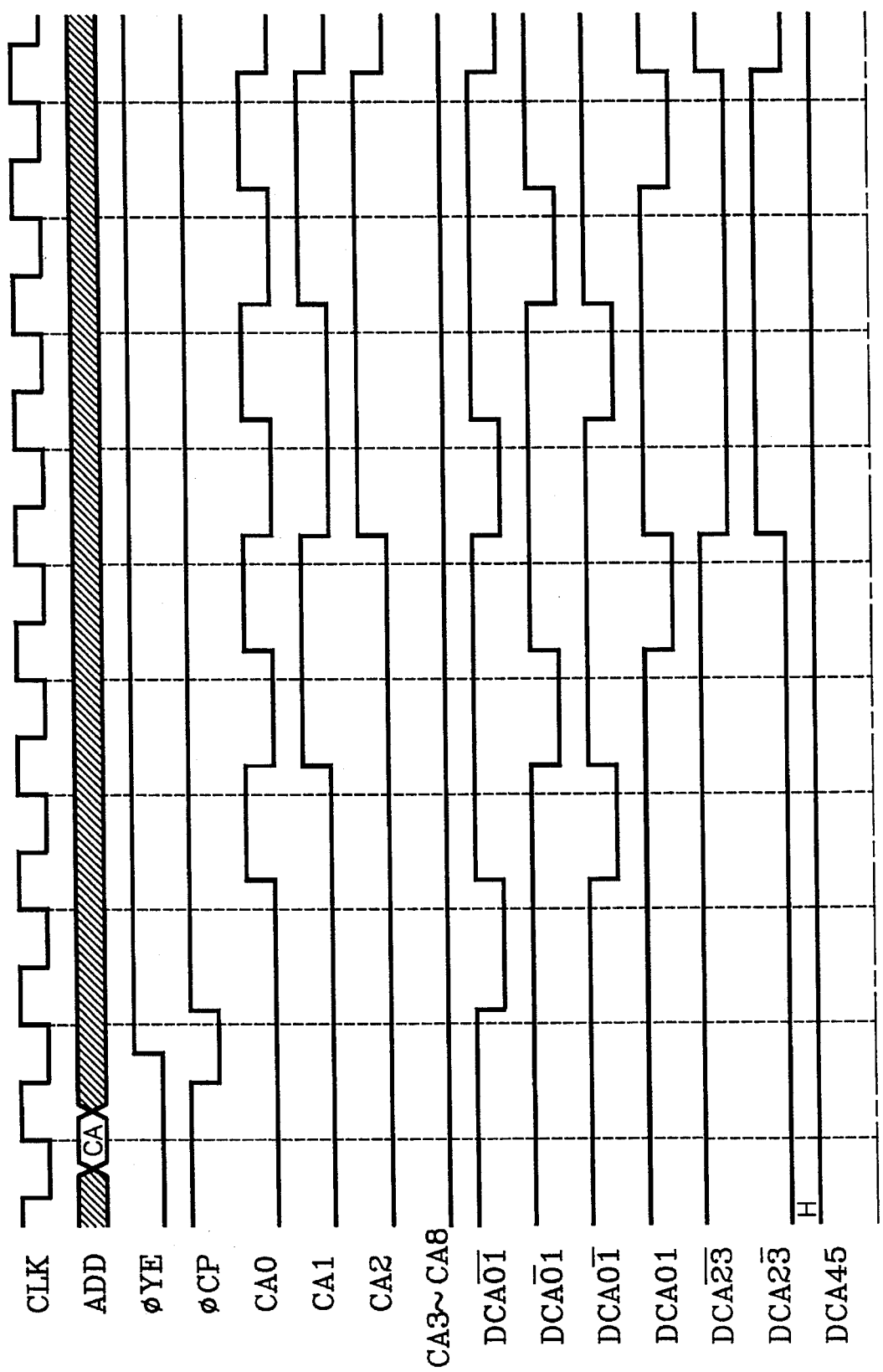
FIG. 8A is a timing diagram showing an operation that an input/output line is selected and driven in the circuits of FIGS. 3 to 7, according to the present invention.
Figure 8B:
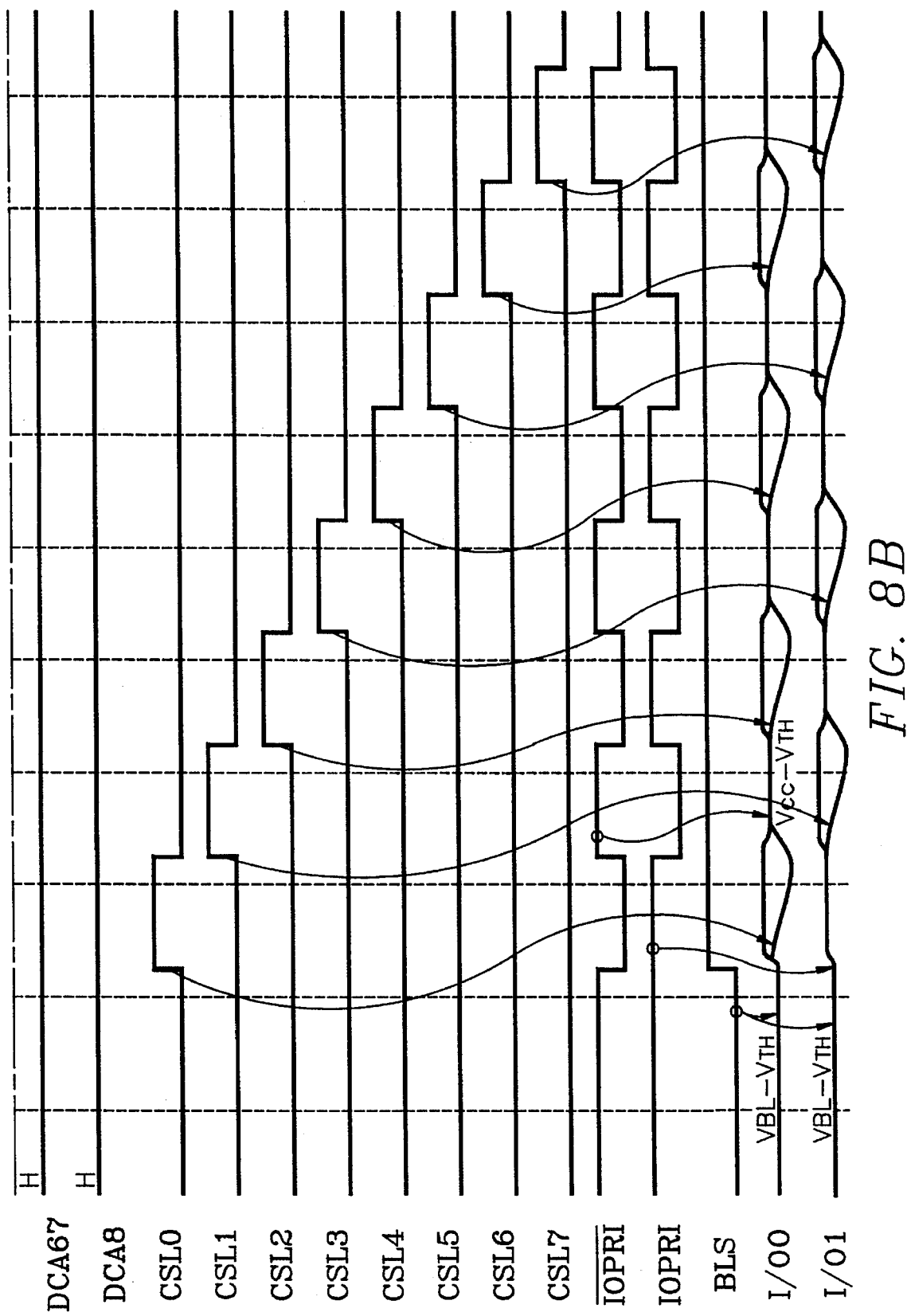
FIG. 8B is a timing diagram extending from FIG. 8A.
Figure 9A:
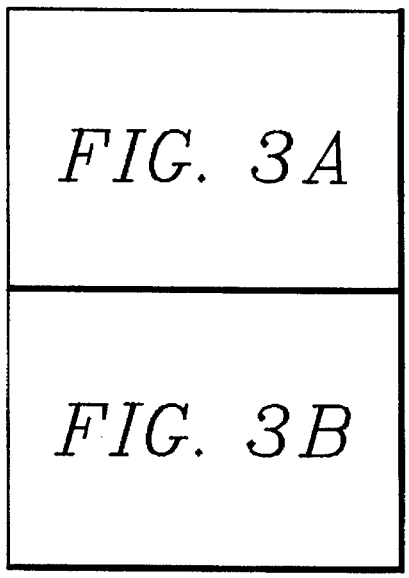
FIGS. 9A and 9B are diagrams respectively showing how
Figure 9B:
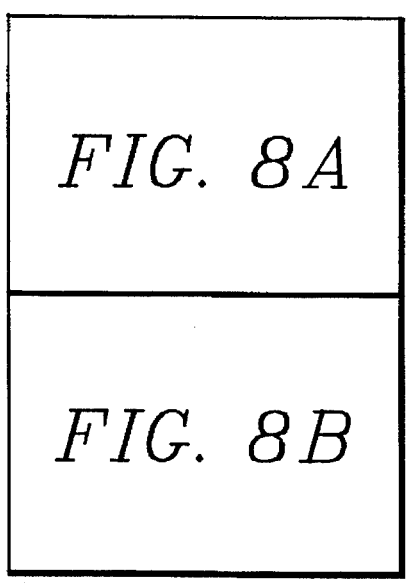

Referring to FIGS. 8A and 8B, operation of the dynamic RAM according to the present invention will be explained hereinbelow. FIGS. 8A and 8B show an example wherein the present invention is applied in a synchronous dynamic RAM performing a data access operation is synchronism with an external synchronous clock CLK. It can also be appreciated that the dynamic RAM according to the present invention can be applied in a high speed memory device.

The column address CA is latched at n-th pulse of the synchronous clock CLK, and an internal address counter generates the column address signals CA0, CA1, CA2, CA3, . . . , and CA8. It should be noted that for the sake of explanation, the signal generation operation performed by logically combining only three column address signals CA0, CA1, and CA2 needed in generation of the eight column selection signals CSL0 through CSL7 is described in the embodiment of the present invention. For this time interval, the other column address signals CA3 through CA8 are at a "low" state. The column predecoding signals $\overline{DCA45}$, $\overline{DCA67}$, and $\overline{DCA8}$ generated in the third to fifth predecoders 300 through 500 shown in FIGS. 4C through 4E are applied to the gates of the NMOS transistors 122, 124, and 126 shown in FIG. 5, and are at a "high" state, thereby rendering the potential at the third control node 603 to go to the ground voltage GND.

Turning to FIGS. 8A and 8B, the block selection signal BLS is at a "low" state before the sub memory cell array shown in FIG. 3 is selected. Further, as shown in FIG. 7, since all of the input/output line pairs I/O1, $\overline{I/O1}$, I/O0, $\overline{I/O0}$, I/O0', $\overline{I/O0'}$, I/O1' and $\overline{I/O1'}$ included in the sub memory cell array are connected to the block precharge circuits 258, 256, 254, and 252 and are connected to the signal BLS, the input/output line pairs are precharged to the potential of BBL-VTH (where VTH represents a threshold voltage of the NMOS transistor). Alternatively, when the sub memory cell array is selected, since the signal BLS is at a "high" state, the input/output line pairs are equalized and precharged by the PMOS transistors 238, 236, 234 and 232, and the precharge circuits 248, 246, 244 and 242 which are controlled by the input/output line precharge signals IOPRI and $\overline{IOPRI}$ in response to the logic states of the column address CA0 and $\overline{CA0}$.

When the block selection signal BLS goes to a "high" state and the sub memory cell array of FIG. 3 is selected, the column selection signals CSL0 through CSL7 are sequentially activated. Operation during the precharge operation according to the generation of the column selection signals will be explained hereinbelow. Since the signal φYE is activated to a "high" state, the predecoding signal is generated from the first column predecoder 100 shown in FIG. 4A. That is, when all of the column addresses CA0, CA1 and CA2 are set to a "low" state, the column predecoding signal DCA$\overline{01}$ is set to a "low" state and the other column predecoding signals DCA$\overline{01}$, DCA$\overline{01}$, and DCA01 are set to a "high" state, so that the NOR gates shown in FIG. 5 with the exception of the first NOR gate 132 and the fifth NOR gate 140 are disabled. Furthermore, the column predecoding signal DCA$\overline{23}$ is set to a "high" state and the other column predecoding signal DCA23 is set to a "low" state, so that the potential at the first control node 601 become a "low" state and the potential at the second control node 602 becomes a "high" state. Therefore, in accordance with the "high" state of the output signal of the first NOR gate 132, only the column selection signal CSL0 is activated to a "high" state and the other column selection signals CSL1 through CSL7 are inactivated to a "low" state. If the word line WL0 is selected in FIG. 3, the 2-bit data read from the bit line pairs BL0, $\overline{BL0}$, BL1 and $\overline{BL1}$ by the activated column selection signal CSL0 are transferred to the input/output line pairs I/O1, $\overline{I/O1}$, I/O0 and $\overline{I/O0}$ on the left hand side of the sub memory cell array via the respective four column selection switches 20. The input/output line pairs I/O1, $\overline{I/O1}$, I/O0 and $\overline{I/O0}$ are developed according to the transferred potential of the data in the respective memory cells 10. Then, since the column address CA0 is at a "low" state in FIG. 6, the input/output line precharge signal IOPRI used in the precharge and equalization of the unselected input/output line pairs, i.e., the input/output line pairs I/O1', $\overline{I/O1}$', I/O0' and $\overline{I/O0}$' on the right hand side of the sub memory cell array is in a "high" state. This enables the PMOS transistors 234 and 232 and the precharge circuits 244 and 242, as shown in FIG. 7. In this way, while the input/output line pairs I/O1, $\overline{I/O1}$, I/O0 and $\overline{I/O0}$ on the left hand side of the sub memory cell array are being developed by the activation of the column selection signal CSL0, the input/output line pairs I/O1', $\overline{I/O1}$', I/O0' and $\overline{I/O0}$' on the right hand side of the sub memory cell array are being equalized and precharged to the potential of Vcc-VTH.

Conversely, if the column address CO0 is at a "high" state, only the column predecoding signal DCA$\overline{01}$ goes to a "low" state and the other column predecoding signals DCA$\overline{01}$, DCA$\overline{01}$, and DCA01 go to a "high" state. Furthermore, the column predecoding signals DCA$\overline{23}$ and DCA23 are still at "high" and "low" states, respectively. Therefore, only the second NOR gate 134 of FIG. 5 is enabled and the other NOR gates are disabled. Under such a state, since the inputs of the second NOR gate 134 go to a "low" level, only the column selection signal CSL1 is activated to a "high" state. In accordance with the activation of the signal CSL1, as shown in FIG. 3, the 2-bit data read from the bit line pairs BL2, $\overline{BL2}$, BL3 and $\overline{BL3}$ are transferred to the input/output line pairs I/O1', $\overline{I/O1}$', I/O0' and $\overline{I/O0}$' on the right hand side of the sub memory cell array via the respective four selection switches 20. The input/output line pairs I/O1', $\overline{I/O1}$', I/O0' and $\overline{I/O0}$' are developed according to the transferred potential of the data in the respective memory cells 10. Then, since the column address CA0 is at a "high" state in FIG. 6, the input/output line precharge signal $\overline{IOPRI}$ used in the precharge and equalization of the input/output line pairs I/O1, $\overline{I/O1}$, I/O0 and $\overline{I/O0}$ on the left hand side of the sub memory cell array is output at a "high" state, thereby enabling the PMOS transistors 238 and 236 and the precharge circuits 248 and 246, as shown in FIG. 7. When the input/output line pairs I/O1', $\overline{I/O1}$', I/O0' and $\overline{I/O0}$' on the right hand side of the sub memory cell array are developed by the activation of the column selection signal CSL1, the input/output line pairs I/O1, $\overline{I/O1}$, I/O0 and $\overline{I/O0}$ on the left hand side of the sub memory cell array are equalized and precharged to the potential of Vcc-VTH.

As mentioned above, the other column selection signals CSL2 through CSL7 are serially generated, as shown in FIGS. 8A and 8B. Furthermore, in the timing diagram of FIGS. 8A and 8B, when the input/output line pairs I/O1, $\overline{I/O1}$, I/O0 and $\overline{I/O0}$ on the left hand side of the sub memory cell array are developed by activation of the even-numbered column selection signals CSL0, CSL2, CSL4, and CSL6, the input/output line pairs I/O1', $\overline{I/O1}$', I/O0' and $\overline{I/O0}$' which are developed by activation of the odd-numbered column selection signals CSL1, CSL3, CSL5, and CSL7 are precharged and equalized by the input/output precharge signal IOPRI activated by the precharge circuit shown in FIG. 6. Conversely, when the input/output line pairs I/O1', $\overline{I/O1}$', I/O0' and $\overline{I/O0}$' are developed by activation of the odd-numbered column selection signals CSL1, CSL3, CSL5, and CSL7, the input/output line pairs I/O1, $\overline{I/O1}$, I/O0 and $\overline{I/O0}$ are precharged and equalized by the input/output precharge signal IOPRI activated by the precharge circuit shown in FIG. 6.

As described above, since the input/output buses on the left and right hand sides of the sub memory cell array are alternately developed and precharged, the short time to inactivate and the long time to activate the column selection signal according to the shortage of the precharge and equalization time is not necessary, providing a significant advantage over the conventional device. Furthermore, since sufficient time is obtained to precharge the input/output line pairs, data can be successively output via a data bus connected to the input/output buses without a delay in the data transfer time due to the conventional development and precharge techniques.

While only the transfer of data to the input/output line pairs from the memory cell is described in the above embodiment of the present invention, it is also possible to drive and precharge the input/output line pairs according to the generation of the aforementioned column selection signal in the case that data applied from the exterior of the chip is transferred to the memory cell via the input/output line pairs. The present invention applies to both reading from and writing to semiconductor memory devices. Furthermore, the input/output line pairs of the sub memory cell array are divided into two parts and are individually operated by the column selection signals. Though the column address signals are generated by the binary count method, it is well known to one skilled in the art that the column address signals can be generated by an interleave method instead of the binary count method.

As mentioned above, the two groups of input/output line pairs are individually driven and precharged by different column selection signals in different time intervals so as to have the time to precharge the input/output line pairs and so as to stably perform the data transfer operation. Furthermore, according to the present invention, the driving operation and the precharge method of the input/output line pairs are applicable to increasing the operation speed of the dynamic RAM in the semiconductor device.

While the invention has been particularly shown and described with reference to a preferred embodiment and alterations thereto, it should be understood by those skilled in the art that various changes in form and detail may be made therein without departing from the spirit and scope of the invention.

What is claimed is:

1. An input/output structure for a semiconductor memory device comprising:

a first plurality of input/output line pairs;

a first plurality of selection signals for selectively activating said first plurality of input/output line pairs;

a second plurality of input/output line pairs different from said first plurality of input/output line pairs;

a second plurality of selection signals for selectively activating said second plurality of input/output line pairs;

said first plurality of input/output line pairs being precharged and equalized when said second plurality of input/output line pairs are selectively activated; and said second plurality of input/output line pairs being precharged and equalized when said first plurality of input/output line pairs are selectively activated.

2. A semiconductor memory device comprising:

a plurality of sub memory cell arrays each including a plurality of memory cells, a plurality of word lines and a plurality of bit line pairs, each of said plurality of word lines being connected to a different sub-plurality of memory cells, and each of said memory cells in each different sub-plurality of memory cells being connected to a different pair of said plurality of bit line pairs;

a plurality of input/output line pairs each switchably connectable to said plurality of sub memory cell arrays, said plurality of input/output line pairs comprising:

a first group of said plurality of input/output line pairs arranged to a first side of each of said plurality of sub memory cell arrays and switchably connectable to a first group of said plurality of bit line pairs of each of said plurality of sub memory cell arrays, and a second group of said plurality of input/output line pairs arranged to a second side of each of said plurality of sub memory cell arrays and switchably connectable to a second group of said plurality of bit line pairs of each of said plurality of sub memory cell arrays, said second group of said plurality of input/output line pairs being different from said first group of said plurality of input/output line pairs; and precharging means for precharging and equalizing each of said second group of said plurality of input/output line pairs when said first group of said plurality of input/output line pairs are connected to said first group of said plurality of bit line pairs, and for precharging and equalizing each of said first group of said plurality of input/output line pairs when said second group of said plurality of input/output line pairs are connected to said second group of said plurality of bit line pairs.

3. A semiconductor memory device according to claim 2, wherein each of said memory cells in each different sub-plurality of memory cells are connected to two different pairs of said plurality of bit line pairs.

4. An input/output structure for a semiconductor memory device including a memory cell array having first and second groups of memory cells, said device comprising:

a first plurality of input/output line pairs switchably connectable to said first group of memory cells by a first plurality of selection signals, at least one pair of said first plurality of input/output line pairs being connected to some of said first group of memory cells by activation of one of said first plurality of selection signals; and a second plurality of input/output line pairs switchably connectable to said second group of memory cells by a second plurality of selection signals, at least one pair of said second plurality of input/output line pairs being connected to some of said second group of memory cells by activation of one of said second plurality of selection signals;

said second plurality of input/output line pairs being precharged and equalized when said at least one pair of said first plurality of input/output line pairs is connected to some of said first group of memory cells; and said first plurality of input/output line pairs being precharged and equalized when said at least one pair of said second plurality of input/output line pairs is connected to some of said second group of memory cells.

5. An input/output structure for a semiconductor memory device according to claim 4, wherein data are alternately transferred through said first plurality of input/output line pairs and said second plurality of input/output line pairs.

6. A semiconductor memory device comprising a plurality of memory cell arrays, each memory cell array comprising:

a plurality of memory cells arranged in an array having row and column directions;

a plurality of bit line pairs arranged in said row direction, one of said plurality of bit line pairs being connected to a row of said plurality of memory cells;

a plurality of word lines arranged in said column direction, one of said plurality of word lines being connected to a column of said plurality of memory cells;

a first plurality of input/output line pairs switchably connectable to a first group of said plurality of bit line pairs and arranged on a first side of said memory cell array;

a second plurality of input/output line pairs switchably connectable to a second group of said plurality of bit line pairs and arranged on a second side of said memory cell array, said second plurality of input/output line pairs being different from said first plurality of input/output line pairs;

a first plurality of selection signals for causing connection of said first plurality of input/output line pairs to said first group of said plurality of bit line pairs, at least one pair of said first plurality of input/output line pairs being switchably connected by activation of one of said first plurality of selection signals; and a second plurality of selection signals for causing connection of said second plurality of input/output line pairs to said second group of said plurality of bit line pairs, at least one pair of said second plurality of input/output line pairs being switchably connected by activation of one of said second plurality of selection signals;

said second plurality of input/output line pairs being precharged and equalized when said at least one pair of said first plurality of input/output line pairs is switchably connected to one of said bit line pairs of said first group of said plurality of bit line pairs; and said first plurality of input/output line pairs being precharged and equalized when said at least one pair of said second plurality of input/output line pairs is switchably connected to one of said bit line pairs of said second group of said plurality of bit line pairs.

7. A semiconductor memory device comprising a plurality of memory cell arrays according to claim 6, wherein:

two pairs of said first plurality of input/output line pairs are switchably connected by activation of one of said first plurality of selection signals; and two pairs of said second plurality of input/output line pairs are switchably connected by activation of one of said second plurality of selection signals.

8. A semiconductor memory device comprising:

a plurality of memory cells arranged in an array having row and column directions;

a first plurality of input/output line pairs switchably connectable to a first group of said plurality of memory cells;

first selection means for causing connection of said first plurality of input/output line pairs to at least one of said first group of said plurality of bit line pairs;

a second plurality of input/output line pairs different from said first plurality of input/output line pairs and switchably connectable to a second group of said plurality of memory cells different from said first group of said plurality of memory cells;

second selection means for causing connection of said second plurality of input/output line pairs to at least one of said second group of said plurality of bit line pairs;

precharge and equalization means for precharging and equalizing each of said first plurality of input/output line pairs when at least one of said second plurality of input/output line pairs is connected to at least one of said second group of said plurality of bit line pairs, and for precharging and equalizing each of said second plurality of input/output line pairs when at least one of said first plurality of input/output line pairs is connected to at least one of said first group of said plurality of bit line pairs.

9. An input/output structure for a semiconductor memory device comprising:

a first plurality of input/output line pairs;

a first plurality of selection signals for selectively activating respective ones of said first plurality of input/output line pairs;

a second plurality of input/output line pairs different from said first plurality of input/output line pairs;

a second plurality of selection signals for selectively activating respective ones of said second plurality of input/output line pairs;

said first plurality of input/output line pairs being precharged and equalized when at least one of said second plurality of input/output line pairs are selectively activated; and said second plurality of input/output line pairs being precharged and equalized when at least one of said first plurality of input/output line pairs are selectively activated.

* * * * *